US009539626B2

(12) United States Patent
Ma et al.

(10) Patent No.: US 9,539,626 B2
(45) Date of Patent: Jan. 10, 2017

(54) METHOD OF ROLLING NIW ALLOY TAPES FOR COATED CONDUCTORS

(71) Applicant: BEIJING UNIVERSITY OF TECHNOLOGY, Beijing (CN)

(72) Inventors: Lin Ma, Beijing (CN); Hong-Li Suo, Beijing (CN); Yi-Chen Meng, Beijing (CN); Ya-Ru Liang, Beijing (CN); Li-Jia Chen, Beijing (CN); Yan Xu, Beijing (CN); Hui Tian, Beijing (CN); Yi Wang, Beijing (CN); Min Liu, Beijing (CN)

(73) Assignee: BEIJING UNIVERSITY OF TECHNOLOGY, Beijing (CN)

( * ) Notice: Subject to any disclaimer, the term of this patent is extended or adjusted under 35 U.S.C. 154(b) by 476 days.

(21) Appl. No.: 14/296,244

(22) Filed: Jun. 4, 2014

(65) Prior Publication Data

US 2015/0135791 A1    May 21, 2015

(30) Foreign Application Priority Data

Nov. 17, 2013  (CN) .......................... 2013 1 0575259

(51) Int. Cl.
*B21B 1/02* (2006.01)
*H01L 39/12* (2006.01)
*C22C 1/02* (2006.01)
*B21B 3/00* (2006.01)
*H01L 39/24* (2006.01)

(52) U.S. Cl.
CPC . *B21B 1/02* (2013.01); *B21B 3/00* (2013.01); *C22C 1/023* (2013.01); *H01L 39/126* (2013.01); *B21B 2265/14* (2013.01); *H01L 39/2454* (2013.01)

(58) Field of Classification Search
CPC .......... B21B 1/02; B21B 3/00; B21B 2265/14; H01L 39/126; H01L 39/2454; C22C 1/023
See application file for complete search history.

(56) References Cited

U.S. PATENT DOCUMENTS

| 8,748,349 B2 * | 6/2014 | Goyal | H01L 39/126 505/237 |
| 2015/0135791 A1 * | 5/2015 | Ma | B21B 1/02 72/199 |
| 2016/0083827 A1 * | 3/2016 | De Boer | C22C 1/023 505/239 |

* cited by examiner

*Primary Examiner* — David B Jones
(74) *Attorney, Agent, or Firm* — J. C. Patents

(57) ABSTRACT

A method of rolling NiW alloy tapes for coated conductors belongs to the technical field of metal materials rolling. According to the method, a cylindrical NiW alloy ingot with a diameter not less than 10 mm is used to be rolled back and forth along the axial direction as a rolling direction, wherein the content of W is 5~7 at. %, and the axis of this ingot is perpendicular to the plane where the axes of working rollers are located. During rolling process, the cross sectional area reduction of the ingot is retained at 5% per pass. When the total cross sectional area reduction of the ingot is larger than 98% and the thickness of the tape is down to 60~100 μm, the rolling is stopped, and thus the NiW alloy tape is obtained. The method has the advantages that the negative influence generated when the NiW alloy tape is produced from a cuboid initial NiW alloy ingot can be reduced as much as possible, the yield of the NiW alloy tapes is increased, as well as relatively ideal effects can be obtained in terms of the surface biaxial texture, the length and the axial quality.

2 Claims, 4 Drawing Sheets

METHOD OF ROLLING NIW ALLOY TAPES FOR COATED CONDUCTORS

CROSS-REFERENCE TO RELATED APPLICATIONS

This application claims the priority benefits of Chinese application No. 201310575259.4 filed on Nov. 17, 2013, the content of which is incorporated herein by reference in its entirety.

TECHNICAL FIELD

This invention relates to a method of rolling NiW alloy tapes (the content of W is 5~7 at. %) for coated conductors and refers to the technical field of metal material rolling process.

BACKGROUND TECHNOLOGY

As the representative of the second-generation high temperature superconducting coated conductors, YBCO (Yttrium, Barium, Copper and Oxide) which has a brittle ceramic structure need to epitaxially grow on a flexible metal tape with a biaxial texture and obtain the biaxial texture to meet the application requirements. Therefore, for the purpose of obtaining the high-performance coated superconducting wires and tapes, the key goal is to prepare the flexible metal tape which has favorable biaxial texture on surface, long length of single tape and uniformity in axial quality.

The NiW alloy is a kind of material for metal alloy tape which is selected for its good mechanical property by applying the rolling assisted biaxially textured substrate (RABiTS) method by scientific workers for years. The NiW alloy tape which has high-quality biaxial texture on surface and about 60~100 μm thickness is produced from the NiW alloy, through heavy rolling and recrystallizing to the NiW alloy ingot (the content of W is 5~7 at. %). But a cuboid initial NiW alloy ingot applied in a traditional rolling method is difficult to reach ideal effects in terms of the biaxial texture on surface, the length and the axial quality, upon the following reasons:

1. in order to obtain the NiW alloy tape with the high-quality biaxial texture, it needs to meet the conditions that during rolling process, the total thickness reduction of cold rolling is larger than 98%, the thickness reduction per pass is retained at certain level, and additionally, the annealing treatment cannot be performed during this process;

2. in the condition of ensuring that the thickness of the final tape is kept about 60-100 μm, in order to produce the tape which is relatively long and meet requirement 1, the initial ingot must be thickened, which will cause the increase of the total deformation of the NiW alloy ingot, resulting in serious strain hardening leading to crack sources easily generating on the both edges of the tape and tape rupture. Although the crack sources on the both edges can be removed by frequently trimming edges, the workload and the loss of materials may be increased, as well as the working hour is prolonged. More importantly, when the deformation of the ingot reaches a certain degree, its deformation effect is not remarkable anymore and a larger rolling force capable of enabling the ingot to deform needs to be provided. Therefore, more energy is consumed and loss of rolling mills is increased; even large-tonnage rolling mills are required, and accordingly, the production cost is greatly increased;

3. with regard to a cuboid initial NiW alloy ingot, hidden troubles to generate cracks described in the item 2 are brought in the subsequent cold rolling deformation processing since much stress is concentrated on the axial side edges in such processes as hot forging and hot rolling etc. before cold rolling;

4. in according to the rolling theory, the rolling process will not be smoothly finished until the width/height ratio of the NiW alloy ingot meets certain proportional relation in a rolling deformation process, that is, in case of meeting the increase in thickness (mentioned in the item 2), the ingot is need to be correspondingly widened. In other words, when the mass of raw materials is increased, the increase in width can affect the increase in length, which generates a negative influence on the expected length of the tape, and also comes up with a higher requirement on the rolling force of rolling equipment;

5. with regard to the rolling process of the long tape, the smaller the difference between the length of the final tape and the length of the initial ingot is, the more profitably the quality of the finished-product tape is well-distributed in the rolling direction, that is, the larger the contribution of the length of the initial ingot is, the longer the length of the final tape is, as well as the larger the contribution of the thickness of the initial ingot is, the more unprofitable it is.

Integrating the above reasons, in the traditional rolling method, the cuboid initial NiW alloy ingot applied in rolling can produce some unprofitable factors to producing the tape and also may cause increase of the production cost, so this is particularly remarkable for the production of the long tape. And therefore, there are some more needed to improve in selecting and rolling methods of the NiW alloy ingot.

SUMMARY OF INVENTION

This invention relates to a method of rolling special NiW alloy tapes (the content of W is 5~7 at. %) for coated conductors, which is capable of reducing the negative influences generated during the process of producing the NiW alloy tape by applying a cuboid initial NiW alloy ingot as much as possible, increasing the yield of the NiW alloy tape and reaching relatively ideal effects in terms of the biaxial texture on the surface, the length and the axial quality.

The method of rolling the special NiW alloy tapes (the content of W is 5~7 at. %) for the coated conductors comprises the following steps:

a cylindrical NiW alloy ingot not less than 10 mm in diameter is used to be rolled back and forth along the axial direction as a rolling direction, wherein the content of W is 5~7 at. % and the axis of the ingot is perpendicular to the plane where the axes of the working rolls are placed;

the cross sectional area reduction of the ingot is retained at 4-6%, for example 5%, per pass during rolling process; the rolling is stopped when the total cross sectional area reduction of the ingot is larger than 98% and the thickness of the tape is down to 60~100 μm, and thus the NiW alloy tape is obtained.

During rolling process, it is needed to meet the condition that the cross sectional area reduction of the ingot per pass is retained at 4-6%, for example 5%. Because the initial cross sectional shapes of both are different, the area reduction is needed to be adopted as a rolling parameter but not simply varying the rolling parameter in application of the thickness of the cuboid initial ingot. The approximate thickness reduction per pass as shown in Table 1 can be obtained through calculation, and its change rule is as shown in FIG. 1. With the increase in quantity of the passes, the thickness reduction per pass of the cylindrical NiW alloy ingot is gradually close to its area reduction (e.g., 5%) per pass, and therefore, after the 25$^{th}$ pass, the cylindrical NiW alloy ingot can be continuously rolled in application of the thickness reduction (e.g., 5%) per pass instead of the area reduction (e.g., 5%) per pass;

When the total cross sectional area reduction of the ingot is larger than 98% and the thickness of the tape is down to 60-100 μm, the rolling is stopped, and thus the NiW alloy tape is obtained; the NiW alloy cannot be dealt with annealing treatment in the whole rolling process.

The rolling process can be continuously conducted without annealing treatment during rolling process.

The obtained NiW alloy tape is trimmed edges and slitting to several pieces with needed width along the rolling direction, and then those are coiled for subsequent heat treatment.

Compared with traditional methods, a process of producing the NiW alloy tape by using the cuboid initial NiW alloy ingot, this new invented method has the advantages that:

1. In the rolling process of the cylindrical NiW alloy ingot, the surface quality of the NiW alloy tape produced by applying a rolling technology, in which the area reduction per pass is 4-6%, for example 5%, the total area reduction is larger than 98% and no annealing treatment is performed during the rolling, is similar to that of the NiW alloy tape produced from the cuboid initial NiW alloy ingot, both of which can obtain profitable surface biaxial textures. But when the initial thicknesses of two ingots are the same, the total quantity of passes required by rolling by using the cylindrical NiW alloy ingot at the area reduction per pass of 5% to obtain the final tape with the same thickness is less than that required by rolling by using the cuboid NiW alloy ingot at the thickness reduction per pass of 5%, and accordingly the production efficiency is high. As shown in FIG. 2, when reaching certain total thickness reduction, light line in an area reduction method is present to the left side of dark line in a thickness reduction method, which indicates that fewer passes are used. For example, when the total thickness reduction reaches 90%, the cylindrical ingot in the area reduction method is processed for about 40 passes (Point A), however, the cuboid ingot in the thickness reduction method is processed for about 45 passes (Point B);

2. As the initial cross sectional area of the cylindrical NiW alloy ingot is circular, when the NiW alloy tape is finally obtained by rolling, its total thickness reductions of various parts along the transverse width of the tape are different, being largest in the middle and smallest in the two edges. The advantages of different reductions reside in that: (1) during rolling, the reduction of the NiW alloy on the two edges of the tape is far smaller than that of the middle part, which makes the strain hardening condition on the edges greatly alleviated, crack sources reduced, the risk of tape rupture decreased, as well as the material loss and workload and labor time caused by frequent trimming of edges reduced, and may cause that required surface biaxial textures cannot be generated in subsequent treatment processing of tape on the two edges s due to insufficient reduction, but the edges of the final tape obtained are needed to be cut off, therefore, almost no effect is caused to the manufactured tape, on the contrary, it is beneficial to finish the process smoothly; and (2) generally, after the rolling is finished by using the cylindrical NiW alloy ingot, the width spread is higher than 10%, meanwhile, the total area reductions of parts in the middle same as the initial cylindrical ingot in width are respectively larger than 98% after redundant width spread parts near two edges are trimmed off. Furthermore, the reductions are increasing following the increase of the width spread in FIG. 3, thus ensuring that the produced tape can form a profitable surface biaxial texture;

3. The initial cross sectional area of the cylindrical NiW alloy ingot is circular and is isotropous, and accordingly, the stress concentration in lateral edges generated in such processes as heat treatment etc. of the cuboid NiW alloy ingot is avoided, and thus the cold rolling and the deformation processing at the later stage are facilitated;

4. In order to obtain the final longer NiW alloy tape, raw materials increased can be used for lengthening the ingot and further effectively used for lengthening the final NiW alloy tape by using the cylindrical alloy ingot. Whereas when the cuboid NiW alloy ingot is used at present, raw materials increased of the same mass are needed to be apportioned to the length, thickness and width, that is unprofitable for lengthening the final NiW alloy tape;

5. As the difference between the length of the final tape and the initial length of the cuboid NiW alloy ingot is larger than that between the length thereof and the initial length of the cylindrical NiW alloy ingot. The length of the cuboid NiW alloy ingot is unprofitable for making the quality of the final tape homogenous along the rolling direction because of having too little contribution to the length of the final NiW alloy tape. Moreover, as for the cylindrical NiW alloy ingot, the longer initial ingot which has a similar initial state along the axial direction can be produced by such methods as hot extruding or hot rotary swag. The contribution from its initial length to the length of the final NiW alloy tape is relatively obvious, thus being extremely advantageous for uniform distribution of the quality along the rolling direction of the final tape.

SPECIFIC EMBODIMENTS

Further detailed descriptions of this invention are described below in combination with embodiments and figures, but this invention is not limited to the following embodiments.

Embodiment 1

Using the cylindrical NiW alloy ingot (the content of W is 5 at. %) in diameter of 10 mm as an initial ingot, the rolling is carried out back and forth in according to the thickness reduction per pass in Table 1 and rolling is stopped when the thickness is 100 μm, and at that moment, the total area reduction is about 98.1%, and thus the NiW alloy tape is obtained after edge trimming treatment.

Figure 1:
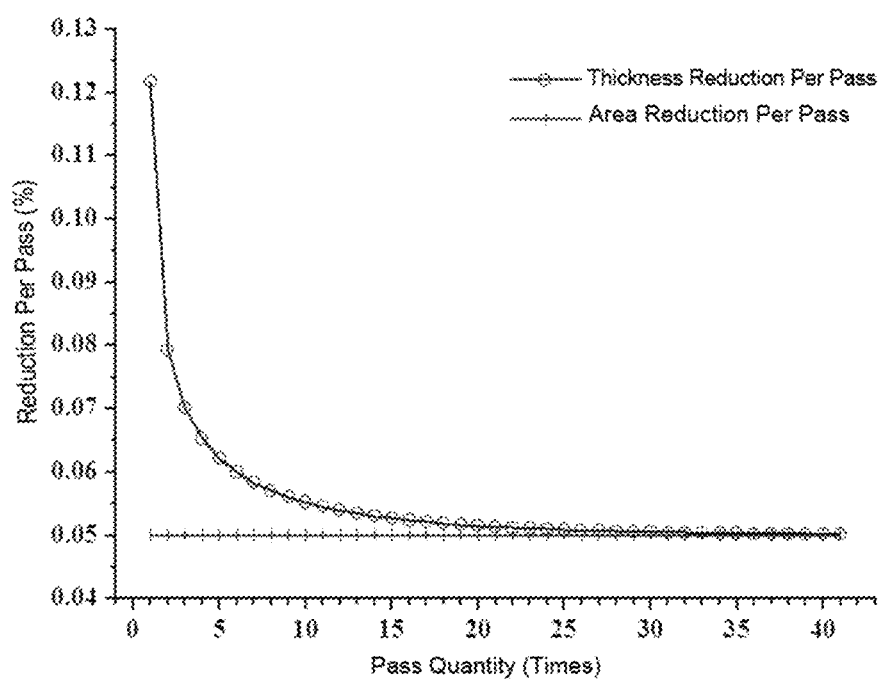
FIG. 1 is a relation curve of area reduction per pass and the thickness reduction per pass to the pass quantity of the cylindrical NiW alloy ingot.
Figure 2:
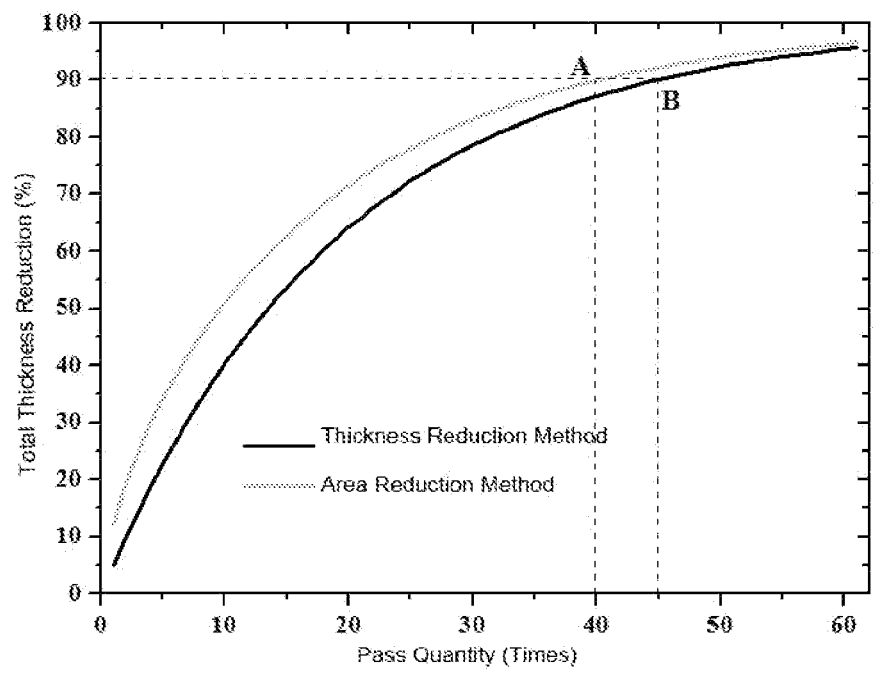
FIG. 2 is a schematic diagram of the total thickness reduction of the ingot and the rolling passes quantity in the processes of respectively rolling by using the cylindrical ingot at the area reduction per pass of 5% and the cuboid ingot at the thickness reduction per pass of 5% when having equal initial ingot thickness and final tape thickness.
Figure 3:
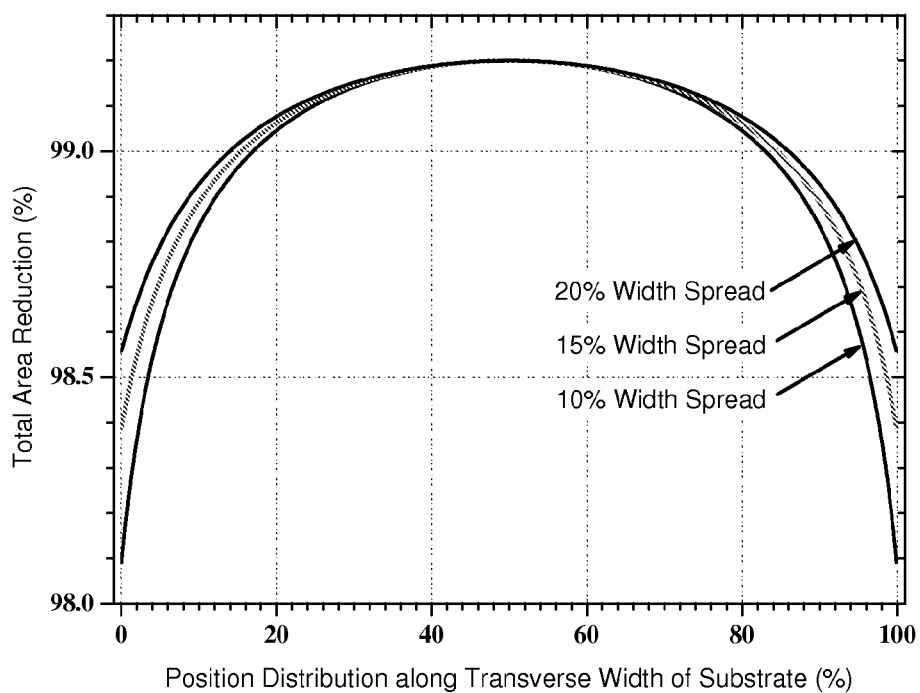
FIG. 3 is the total area reduction distribution of parts in the middle same as the initial cylindrical ingot in width, after redundant width spread parts near the two edges of the final NiW alloy tape produced by using the cylindrical NiW alloy ingot are removed.
Figure 4:
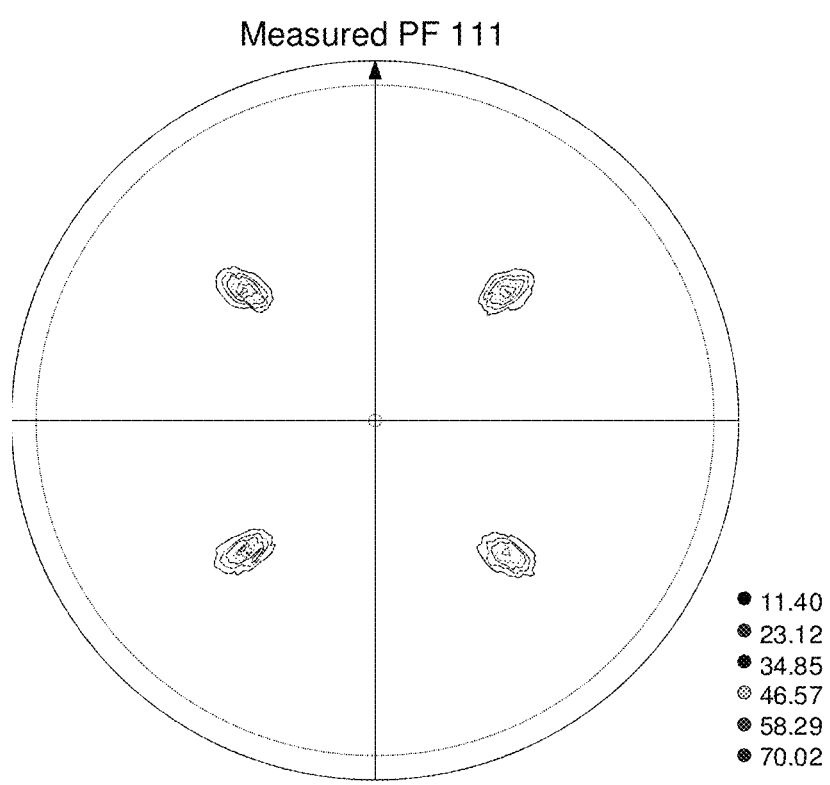
FIG. 4 is a pole figure (111) of the surface of the NiW alloy tape of which the content of W is 5 at. % and the thickness is 100 μm.

An X-ray diffractometer is used to measure texture on the surface of the annealed NiW alloy tape to obtain the pole figure (111) of the surface of the tape as shown in FIG. 4. The pole figure shows that the surface of the NiW alloy tape has highly-concentrated cubic texture and can meet the requirement of the YBCO superconducting material on the flexible metal tape.

Embodiment 2

Using the cylindrical NiW alloy ingot (the content of W is 7 at. %) in diameter of 12 mm as an initial ingot, rolling is carried out back and forth along in according to the pass thickness reduction in Table 1 and rolling is stopped when the thickness is 60 μm, and at that moment, the total area reduction is about 99.0%, and thus the NiW alloy tape is obtained after edge trimming treatment.

Figure 5:
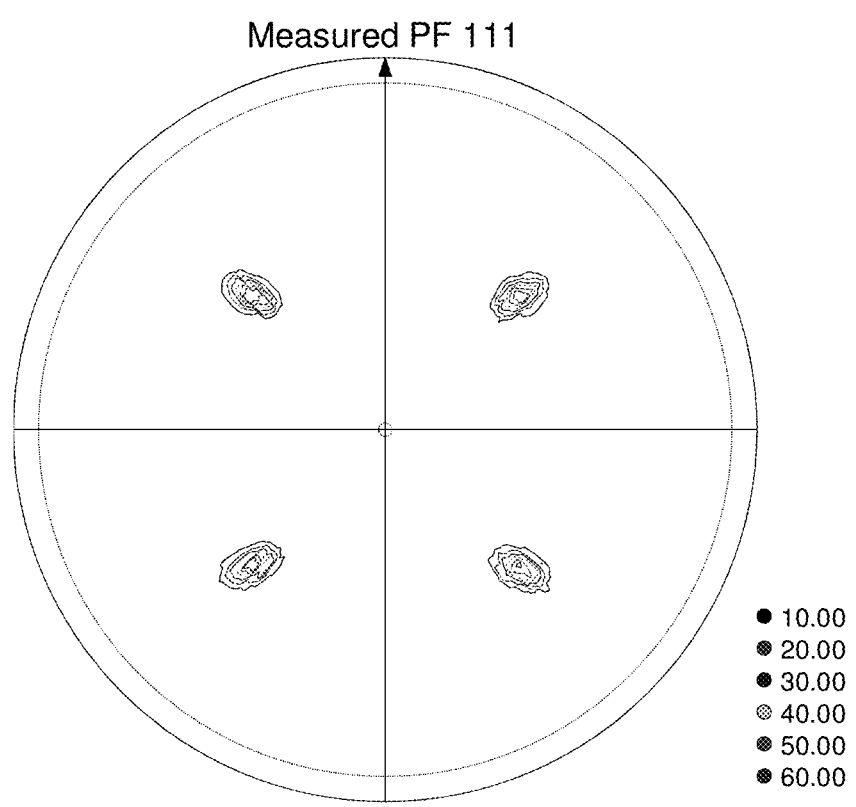
FIG. 5 is a pole figure (111) of the surface of the NiW alloy tape of which the content of W is 7 at. % and the thickness is 60 μm.

An X-ray diffractometer is used to measure texture on the surface of the annealed NiW alloy tape to obtain the pole figure (111) of the surface of the tape as shown in FIG. 5. The pole figure shows that the surface of the NiW alloy tape has highly-concentrated cubic texture and can meet the requirement of the YBCO superconducting material on the flexible metal tape.

Table 1 shows the approximate thickness reduction per pass which is obtained by calculation when the area reduction per pass of the cylindrical NiW alloy ingot is retained at 5%.

TABLE 1

| Pass | Area Reduction per pass (%) | Reduction per pass (%) | Pass | Area Reduction per pass (%) | Thickness Reduction per pass (%) |
| --- | --- | --- | --- | --- | --- |
| 1 | 5.0 | 12.2 | 21 | 5.0 | 5.13 |
| 2 | 5.0 | 7.9 | 22 | 5.0 | 5.12 |
| 3 | 5.0 | 7.0 | 23 | 5.0 | 5.11 |
| 4 | 5.0 | 6.5 | 24 | 5.0 | 5.10 |
| 5 | 5.0 | 6.2 | 25 | 5.0 | 5.09 |
| 6 | 5.0 | 6.0 | 26 | 5.0 | 5.08 |
| 7 | 5.0 | 5.8 | 27 | 5.0 | 5.07 |
| 8 | 5.0 | 5.7 | 28 | 5.0 | 5.06 |
| 9 | 5.0 | 5.6 | 29 | 5.0 | 5.055 |
| 10 | 5.0 | 5.5 | 30 | 5.0 | 5.050 |
| 11 | 5.0 | 5.45 | 31 | 5.0 | 5.045 |
| 12 | 5.0 | 5.40 | 32 | 5.0 | 5.040 |
| 13 | 5.0 | 5.35 | 33 | 5.0 | 5.037 |
| 14 | 5.0 | 5.30 | 34 | 5.0 | 5.033 |
| 15 | 5.0 | 5.27 | 35 | 5.0 | 5.030 |
| 16 | 5.0 | 5.24 | 36 | 5.0 | 5.027 |
| 17 | 5.0 | 5.21 | 37 | 5.0 | 5.024 |
| 18 | 5.0 | 5.19 | 38 | 5.0 | 5.022 |
| 19 | 5.0 | 5.17 | 39 | 5.0 | 5.019 |
| 20 | 5.0 | 5.15 | 40 | 5.0 | 5.017 |

What is claimed is:

1. A method of rolling NiW alloy tape for coated conductors, comprising the following steps:
   rolling back and forth a cylindrical NiW alloy ingot with a diameter not less than 10 mm along an axis of the ingot, wherein the content of W is 5~7 at. % and the axis of the ingot is perpendicular to a plane where axes of working rollers are placed; and
   during the process of rolling the cylindrical NiW alloy ingot, cross sectional area reduction of the ingot is retained at 4-6% per pass; and the rolling is stopped when a total cross sectional area reduction of the ingot is larger than 98% and the thickness of the tape is down to 60~100 μm, and thus the NiW alloy tape is obtained.

2. The method of claim 1, wherein during the process of rolling the cylindrical NiW alloy ingot, the cross sectional area reduction of the ingot is retained at 5% per pass.

* * * * *